US010187102B2

United States Patent
Tang et al.

(10) Patent No.: US 10,187,102 B2
(45) Date of Patent: Jan. 22, 2019

(54) RADIO REMOTE UNIT, RECEIVER, AND BASE STATION

(71) Applicant: Huawei Technologies Co., Ltd., Shenzhen, Guangdong (CN)

(72) Inventors: Haizheng Tang, Shanghai (CN); Xiaomin Zhou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/897,046

(22) Filed: Feb. 14, 2018

(65) Prior Publication Data
US 2018/0175897 A1 Jun. 21, 2018

Related U.S. Application Data

(63) Continuation of application No. PCT/CN2015/087674, filed on Aug. 20, 2015.

(51) Int. Cl.
*H04W 68/08* (2009.01)
*H04B 1/30* (2006.01)
(Continued)

(52) U.S. Cl.
CPC ............... *H04B 1/30* (2013.01); *H03D 7/166* (2013.01); *H04B 1/005* (2013.01); *H04B 1/0096* (2013.01);
(Continued)

(58) Field of Classification Search
CPC ................................ H04W 88/08; H04L 27/18
(Continued)

(56) References Cited

U.S. PATENT DOCUMENTS

2006/0252380 A1 11/2006 Khayrallah et al.
2012/0027401 A1 2/2012 Wood et al.
(Continued)

FOREIGN PATENT DOCUMENTS

CN 2733753 Y 10/2005
CN 101189799 A 5/2008
(Continued)

OTHER PUBLICATIONS

International Search Report issued in International Application No. PCT/CN2015/087674 dated May 19, 2016, 6 pages.
(Continued)

*Primary Examiner* — John J Lee
(74) *Attorney, Agent, or Firm* — Fish & Richardson P.C.

(57) ABSTRACT

Embodiments of the present disclosure disclose a radio remote unit, a receiver, and a base station. The radio remote unit includes at least one receive channel pair, a first local oscillator module, a second local oscillator module, a local oscillator switching switch, and a controller. Each receive channel pair includes a first receive channel and a second receive channel. Each receive channel in each receive channel pair includes a filtering module, a frequency mixing module connected to the filtering module, and a digital processing module connected to the frequency mixing module. A frequency mixing module on the second receive channel is connected to the first local oscillator module and the second local oscillator module by the local oscillator switching switch. The controller is configured to receive an operating mode that is sent by a base station, and control the local oscillator switching switch to perform switching.

9 Claims, 15 Drawing Sheets

(51) Int. Cl.
*H04W 88/08* (2009.01)
*H03D 7/16* (2006.01)
*H04B 1/00* (2006.01)

(52) U.S. Cl.
CPC ......... *H04W 88/08* (2013.01); *H04W 88/085* (2013.01); *H04B 2001/307* (2013.01)

(58) Field of Classification Search
USPC ....... 455/68, 67.11, 515, 550.1, 551, 78, 86, 455/95
See application file for complete search history.

(56) References Cited

U.S. PATENT DOCUMENTS

| | | |
|---|---|---|
| 2012/0243449 A1 | 9/2012 | He |
| 2015/0110229 A1 | 4/2015 | Kim et al. |
| 2015/0285887 A1* | 10/2015 | Bollenbeck ........ G01R 33/3621 324/322 |
| 2015/0372644 A1* | 12/2015 | Boos .................... H03B 5/32 331/46 |
| 2016/0094249 A1* | 3/2016 | Naeini ................ H04B 1/0021 455/189.1 |
| 2016/0285469 A1* | 9/2016 | Raaf ...................... H03M 1/08 |

FOREIGN PATENT DOCUMENTS

| | | |
|---|---|---|
| CN | 101841345 A | 9/2010 |
| CN | 101877917 A | 11/2010 |
| CN | 101908896 A | 12/2010 |
| CN | 102096079 A | 6/2011 |
| CN | 103503227 A | 1/2014 |
| CN | 203933539 U | 11/2014 |
| WO | 2012100372 A1 | 8/2012 |

OTHER PUBLICATIONS

Extended European Search Report issued in European Application No. 15901515.5 dated Jun. 13, 2018, 10 pages.

* cited by examiner

RADIO REMOTE UNIT, RECEIVER, AND BASE STATION

CROSS-REFERENCE TO RELATED APPLICATIONS

This application is a continuation of International Application No. PCT/CN2015/087674, filed on Aug. 20, 2015, the disclosure of which is hereby incorporated by reference in its entirety.

TECHNICAL FIELD

Embodiments of the present invention relate to the field of communications technologies, and in particular, to a radio remote unit (English: Radio Remote Unit, RRU for short), a receiver, and a base station.

BACKGROUND

With the development of wireless communication, a quantity of users continuously increases, and this requires an increased quantity of frequency bands supported by a base station. For reducing costs and a quantity of antennas, that multiple frequency bands share one antenna becomes a trend in the future.

At present, an antenna used by the base station is mainly a dual-polarized antenna. One dual-polarized antenna may support 2R (two-receive), and two dual-polarized antennas may support 4R (four-receive). As shown in FIG. 1A and FIG. 1B, FIG. 1A and FIG. 1B are a schematic diagram of composition of a receiver frequently used in the current base station. The receiver includes two dual-polarized antennas (which support 4R), two power dividers (power splitters), and multiple receive channels (two main receiving channels, two diversity receiving channels, and two inter-frequency channel groups, where each inter-frequency channel group includes N−1 inter-frequency receive channels). Each receive channel includes two same filters, a low noise amplifier, a numerical control attenuator, a frequency mixer, an automatic gain control (English: automatic gain control, AGC for short), and an analog-to-digital converter (English: analog-to-digital converter, ADC for short). For each receive channel, filtering is first performed, by a first filter for the first time, on a radio frequency signal that is received by the dual-polarized antenna; then amplification is performed by the low noise amplifier; then filtering is performed by a second filter for the second time; then attenuation adjustment is performed by the numerical control attenuator; then frequency mixing is performed by the frequency mixer on the radio frequency signal and a local oscillator signal that is output by a local oscillator; then gain adjustment is performed by the AGC; and finally analog-to-digital conversion is performed by the ADC, so that a digital signal is obtained. In FIG. 1A and FIG. 1B, an "$R_i$ filter" represents that a passband of the filter is a frequency band $R_i$ where $1 \leq i \leq N$. The receiver may support not only an intra-frequency mode (that is, a frequency band of a signal transmitted on the diversity receiving channel is the same as a frequency band of a signal transmitted on the main receiving channel) but also an inter-frequency mode (that is, a frequency band of a signal transmitted on an inter-frequency channel is different from the frequency band of a signal transmitted on the main receiving channel).

However, the receiver has the following disadvantages: A quantity of frequency bands supported by the base station is increased by mainly increasing a quantity of receive channels (including a diversity receiving channel and an inter-frequency receive channel) in the receiver; however, a larger quantity of receive channels leads to a larger volume of the receiver, and this is unfavorable to miniaturization of the base station; in addition, costs for deploying multiple receive channels are relatively high.

SUMMARY

Embodiments of the present invention provide a radio remote unit, a receiver, and a base station, to reduce a quantity of receive channels, so that a volume of a receiver is reduced, a base station is miniaturized, and costs for deploying the receive channels may be reduced.

To achieve the foregoing objective, the following technical solutions are used in the embodiments of the present invention:

According to a first aspect of the embodiments of the present invention, a radio remote unit RRU is provided, including at least one receive channel pair, a first local oscillator module, a second local oscillator module, a local oscillator switching switch, and a controller, where each receive channel pair includes a first receive channel and a second receive channel, the first receive channel is connected to the first local oscillator module, the second receive channel is connected to the first local oscillator module and the second local oscillator module by using the local oscillator switching switch, and the controller is connected to the second local oscillator module and the local oscillator switching switch;

each receive channel in each receive channel pair includes a filtering module, a frequency mixing module connected to the filtering module, and a digital processing module connected to the frequency mixing module, where a frequency mixing module on the first receive channel is connected to the first local oscillator module, and a frequency mixing module on the second receive channel is connected to the first local oscillator module and the second local oscillator module by using the local oscillator switching switch; and the controller is configured to: receive an operating mode that is sent by a base station; and if the operating mode is an intra-frequency mode, control the local oscillator switching switch to perform switching, so that the frequency mixing module on the second receive channel is connected to the first local oscillator module; or if the operating mode is an inter-frequency mode, control the local oscillator switching switch to perform switching, so that the frequency mixing module on the second receive channel is connected to the second local oscillator module, and configure a frequency of a local oscillator signal output by the second local oscillator module as a local oscillator frequency indicated by the inter-frequency mode.

With reference to the first aspect, in a first possible implementation of the first aspect, the filtering module includes a first order filtering submodule, a low noise amplifier connected to the first order filtering submodule, a second order filtering submodule connected to the low noise amplifier, and a numerical control attenuator connected to the second order filtering submodule;

a second order filtering submodule on the first receive channel includes a first filter and N second filters, a passband of the first filter is a first frequency band, and all passbands of the N second filters are different from the passband of the first filter; and a first order filtering submodule on the first receive channel includes filters that are the same as the filters included in the second order filtering submodule on the first receive channel, where N is a positive integer;

a second order filtering submodule on the second receive channel includes a third filter, and a passband of the third filter is the first frequency band; a first order filtering submodule on the second receive channel includes a filter that is the same as the third filter; a filtering module on the second receive channel further includes a 1-out-of-N switch; and a numerical control attenuator on the second receive channel is connected to the N second filters and the third filter by using the 1-out-of-N switch; and the controller is connected to the 1-out-of-N switch, and is configured to: if the operating mode is the intra-frequency mode, control the 1-out-of-N switch to perform switching, so that the numerical control attenuator on the second receive channel is connected to the third filter; or if the operating mode is the inter-frequency mode, control the 1-out-of-N switch to perform switching, so that the numerical control attenuator on the second receive channel is connected to a filter, in the N second filters, whose passband is a passband indicated by the inter-frequency mode.

With reference to the first possible implementation of the first aspect, in a second possible implementation of the first aspect, the second order filtering submodule on the first receive channel is a first multiplexer including the first filter and the N second filters, and the first order filtering submodule on the first receive channel is a second multiplexer that is the same as the first multiplexer.

With reference to the first possible implementation of the first aspect, in a third possible implementation of the first aspect, the second order filtering submodule on the first receive channel includes a combiner, the first filter, and the N second filters, where the first filter and the N second filters are connected to the combiner; and the first order filtering submodule on the first receive channel is a third multiplexer including the filters that are the same as the filters included in the second order filtering submodule on the first receive channel.

With reference to the foregoing possible implementations of the first aspect, in a fourth possible implementation of the first aspect, the frequency mixing module on the first receive channel and the frequency mixing module on the second receive channel are frequency mixers; and a digital processing module on the first receive channel and a digital processing module on the second receive channel include an automatic gain control AGC and an analog-to-digital converter ADC that is connected to the AGC.

With reference to the fourth possible implementation of the first aspect, in a fifth possible implementation of the first aspect, the first order filtering submodule on the first receive channel is connected to one interface of a dual-polarized antenna, and the first order filtering submodule on the second receive channel is connected to the other interface of the dual-polarized antenna.

With reference to the fourth possible implementation of the first aspect, in a sixth possible implementation of the first aspect, the at least one receive channel pair includes a first receive channel pair and a second receive channel pair, a first order filtering submodule on a first receive channel in the first receive channel pair is connected to one interface of a dual-polarized antenna, and a first order filtering submodule on a first receive channel in the second receive channel pair is connected to the other interface of the dual-polarized antenna.

According to a second aspect of the embodiments of the present invention, a receiver is provided, including the radio remote unit RRU according to any one of the first aspect, or possible implementations of the first aspect of the embodiments of the present invention.

According to a third aspect of the embodiments of the present invention, a base station is provided, including the receiver according to the second aspect of the embodiments of the present invention.

The embodiments of the present invention provide the radio remote unit, the receiver, and the base station. The radio remote unit (RRU) includes the at least one receive channel pair, the first local oscillator module, the second local oscillator module, the local oscillator switching switch, and the controller. Compared with the prior art in which a quantity of frequency bands supported by a base station is increased by increasing a quantity of receive channels, the RRU uses the controller to control the local oscillator switching switch to perform switching, so that the frequency mixing module on the second receive channel is connected to the first local oscillator module, to support the intra-frequency mode, and a signal, whose frequency band is the same as a frequency band of a signal transmitted on the first receive channel, may be transmitted on the second receive channel; or uses the controller to control the local oscillator switching switch to perform switching, so that the frequency mixing module on the second receive channel is connected to the second local oscillator module, and configure the frequency of the local oscillator signal output by the second local oscillator module as the local oscillator frequency indicated by the inter-frequency mode, to support the inter-frequency mode, so that a signal, whose frequency band is different from a frequency band of a signal transmitted on the first receive channel, may be transmitted on the second receive channel. In this embodiment, signals in different frequency bands may be transmitted on the second receive channel, and there is no need to deploy a receive channel for a signal in each frequency band. Therefore, the RRU in this embodiment may be used to reduce a quantity of receive channels, so that a volume of a receiver is reduced, and costs for deploying the receive channels are reduced.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1A:
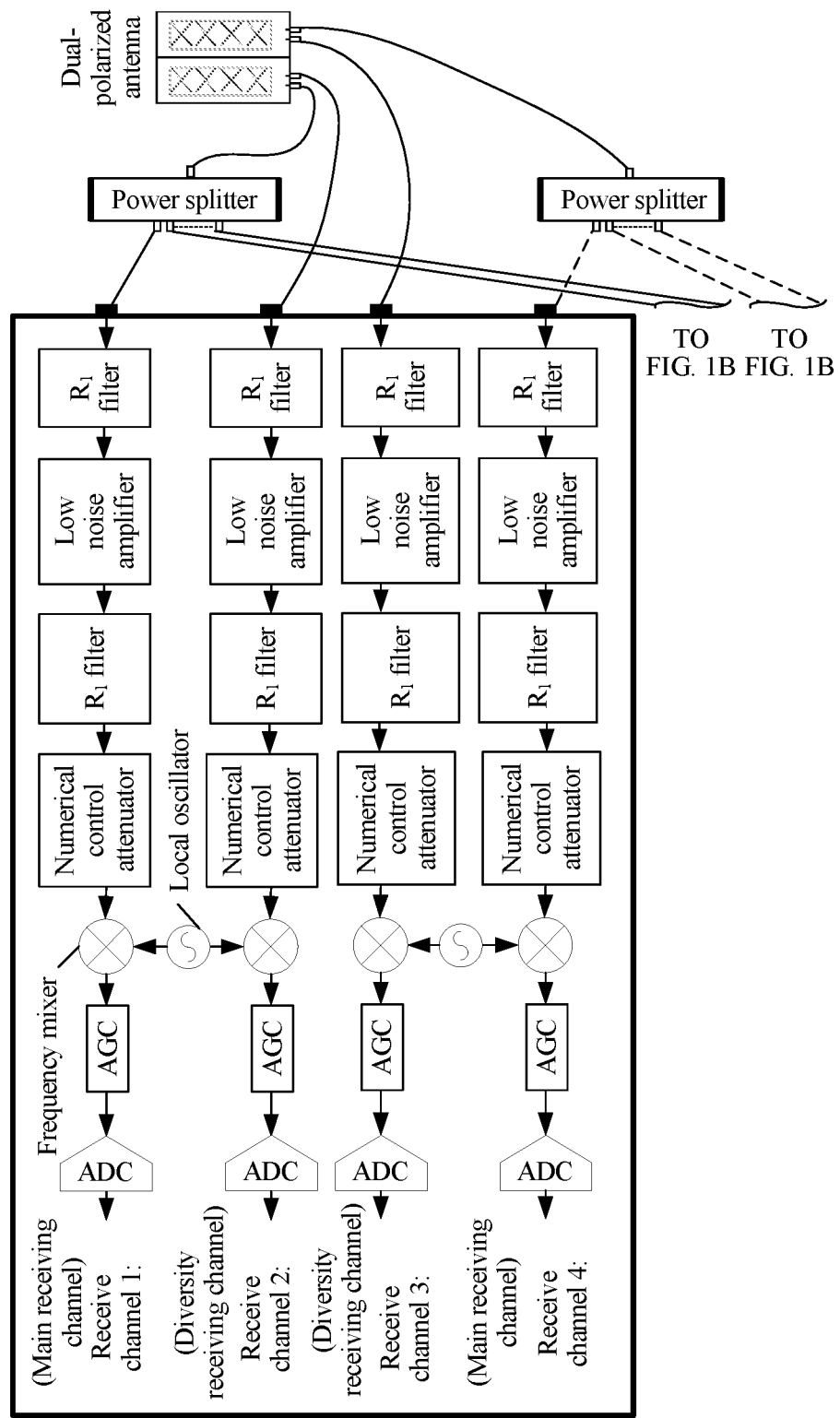
FIG. 1A and FIG. 1B are a schematic diagram of composition of a receiver in the prior art.
Figure 1B:
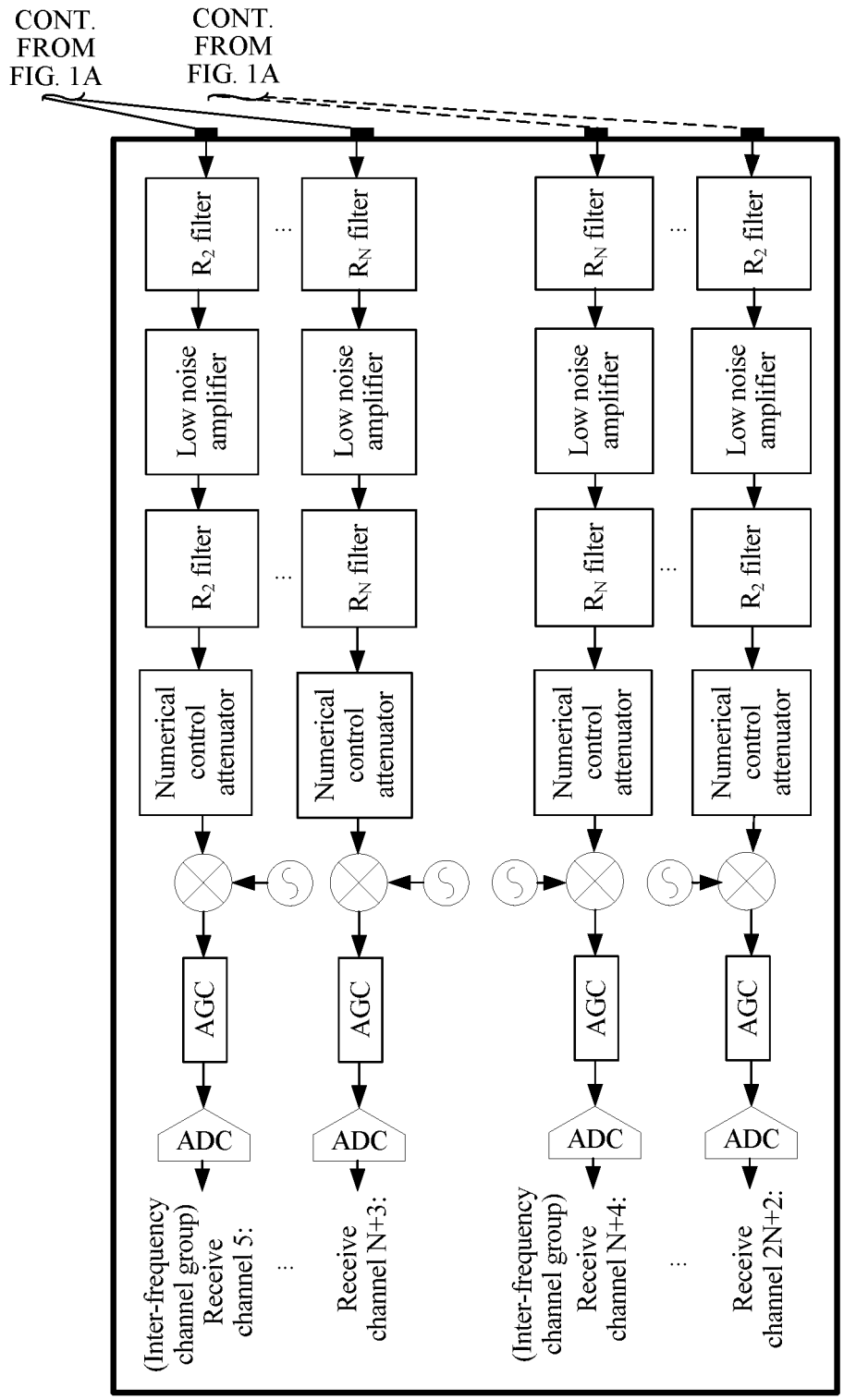

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Technologies described in this specification may be applied to various wireless communications systems, for example, current 2G and 3G communications systems and a next-generation communications system, for example, a Global System for Mobile communications (English: Global System for Mobile communications, GSM for short), a Code Division Multiple Access (English: Code Division Multiple Access, CDMA for short) system, a Time Division Multiple Access (English: Time Division Multiple Access, TDMA for short) system, a Wideband Code Division Multiple Access (English: Wideband Code Division Multiple Access Wireless, WCDMA for short) system, a Frequency Division Multiple Access (English: Frequency Division Multiple Addressing, FDMA for short) system, an Orthogonal Frequency Division Multiple Access (English: Orthogonal Frequency-Division Multiple Access, OFDMA for short) system, a single-carrier FDMA (SC-FDMA for short) system, a general packet radio service (English: General Packet Radio Service, GPRS for short) system, a Long Term Evolution (English: Long Term Evolution, LTE for short) system, and other communications systems.

A base station in this specification may be a device that is in an access network and that communicates with a wireless terminal over an air interface by using one or more sectors. The base station may be configured to mutually convert a received over-the-air frame and an Internet Protocol (English: Internet Protocol, IP for short) packet and serve as a router between the wireless terminal and a remaining portion of the access network, where the remaining portion of the access network may include an IP network. The base station may further coordinate attribute management of the air interface. For example, the base station may be a base transceiver station (English: Base Transceiver Station, BTS for short) in GSM or CDMA, may be a NodeB (NodeB) in WCDMA, or may be an evolved NodeB (English: evolutional Node B, eNB or e-NodeB for short) in LTE, which is not limited in the present invention.

An embodiment of the present invention provides a radio remote unit (English: Radio Remote Unit, RRU for short), as shown in FIG. 2, including at least one receive channel pair 11, a first local oscillator module 12, a second local oscillator module 13, a local oscillator switching switch 14, and a controller 15.

Each receive channel pair includes a first receive channel 111 and a second receive channel 112. The first receive channel 111 is connected to the first local oscillator module 12, and the second receive channel 112 is connected to the first local oscillator module 12 and the second local oscillator module 13 by using the local oscillator switching switch 14. The controller 15 is connected to the second local oscillator module 13 and the local oscillator switching switch 14.

The controller 15 may be a central processing unit (English: Central Processing Unit, CPU for short), or may be a component or an apparatus having a control function, such as a field-programmable gate array (English: Field-Programmable Gate Array) or an application-specific integrated circuit (English: application specific integrated circuit, ASIC for short). The first local oscillator module 12 and the second local oscillator module 13 are configured to output a local oscillator signal, and the first local oscillator module 12 and the second local oscillator module 13 may be local oscillators, or may be other circuits that can generate a local oscillator signal. This is not limited in this embodiment of the present invention.

Figure 2:
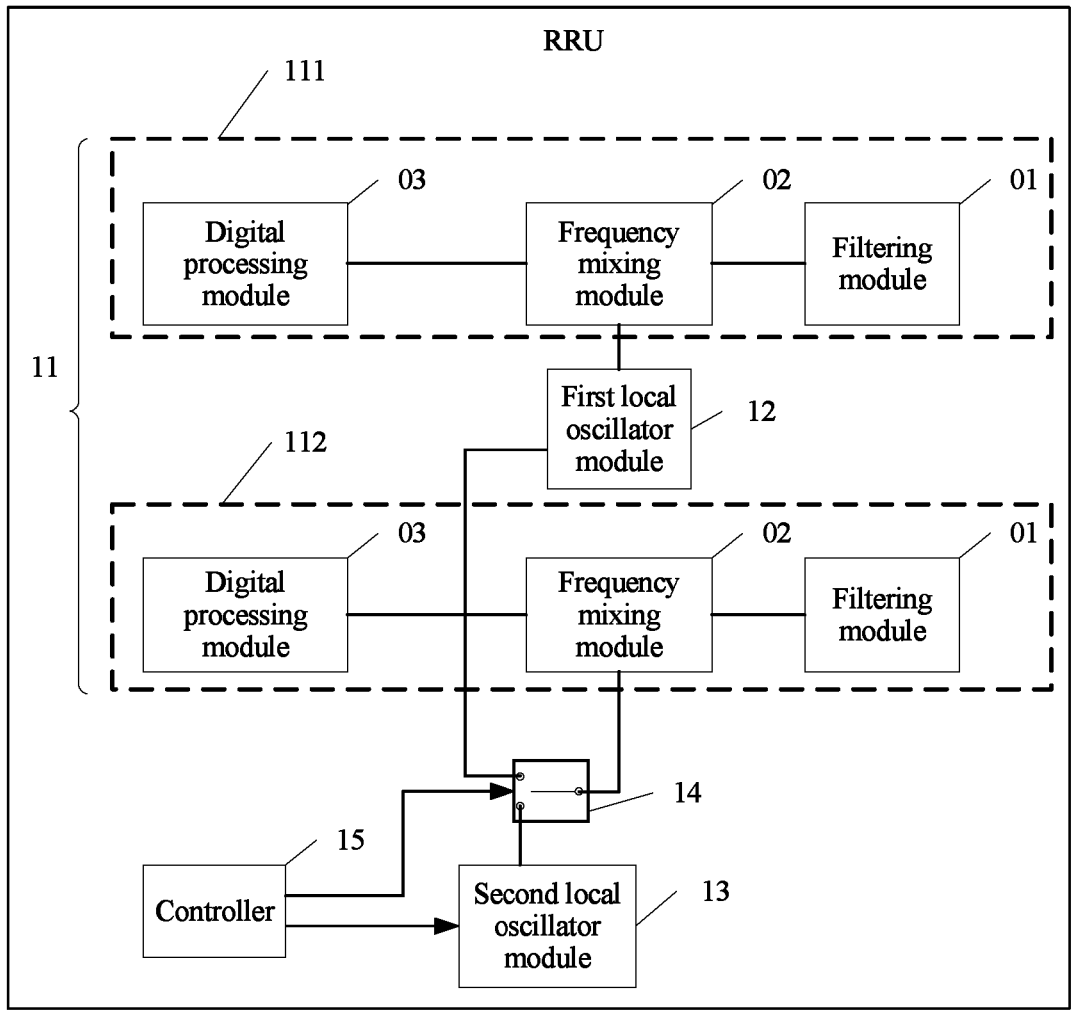
FIG. 2 is a schematic diagram of composition of an RRU according to an embodiment of the present invention.

As shown in FIG. 2, each receive channel in each receive channel pair includes a filtering module 01, a frequency mixing module 02 connected to the filtering module 01, and a digital processing module 03 connected to the frequency mixing module 02. The filtering module 01 is configured to filter a radio frequency signal that is received by the RRU, and input a filtered signal into the frequency mixing module 02. The frequency mixing module 02 is configured to perform frequency mixing on the signal input by the filtering module 01 and a local oscillator signal output by the first local oscillator module 12 or a local oscillator signal output by the second local oscillator module 13, to obtain an intermediate frequency signal. The digital processing module 03 is configured to perform digital processing on the intermediate frequency signal that is obtained by the frequency mixing module 02 after frequency mixing, to obtain a digital signal.

A frequency mixing module 02 on the first receive channel 111 is connected to the first local oscillator module 12, and a frequency mixing module 02 on the second receive channel 112 is connected to the first local oscillator module 12 and the second local oscillator module 13 by using the local oscillator switching switch 14.

The controller 12 is configured to: receive an operating mode that is sent by a base station; and if the operating mode is an intra-frequency mode, control the local oscillator switching switch 14 to perform switching, so that the frequency mixing module 02 on the second receive channel 112 is connected to the first local oscillator module 12, and therefore the local oscillator signal output by the first local oscillator module 12 may be simultaneously input into the frequency mixing module 02 on the first receive channel 111 and the frequency mixing module 02 on the second receive channel 112; or if the operating mode is an inter-frequency mode, control the local oscillator switching switch 14 to perform switching, so that the frequency mixing module 02 on the second receive channel 112 is connected to the second local oscillator module 13, and configure a frequency of the local oscillator signal output by the second local oscillator module 13 as a local oscillator frequency indicated by the inter-frequency mode, so that the local oscillator signal output by the first local oscillator module 12 may be input into the frequency mixing module 02 on the first receive channel 111, and the local oscillator signal output by the second local oscillator module 13 may be input into the frequency mixing module 02 on the second receive channel 112.

It should be noted that a frequency of the local oscillator signal output by the first local oscillator module 12 is different from the frequency of the local oscillator signal output by the second local oscillator module 13, the frequency of the local oscillator signal output by the first local oscillator module 12 may be a fixed frequency, and the frequency of the local oscillator signal output by the second local oscillator module 13 may be configured by the controller 12.

The RRU provided in this embodiment includes the at least one receive channel pair 11, the first local oscillator module 12, the second local oscillator module 13, the local oscillator switching switch 14, and the controller 15. Compared with the prior art in which a quantity of frequency bands supported by a base station is increased by increasing a quantity of receive channels, the controller 15 controls the local oscillator switching switch 14 to perform switching, so that the frequency mixing module 02 on the second receive channel 112 is connected to the first local oscillator module 12, to support the intra-frequency mode, and a signal, whose frequency band is the same as a frequency band of a signal transmitted on the first receive channel 111, may be transmitted on the second receive channel 112; or the controller 15 controls the local oscillator switching switch 14 to perform switching, so that the frequency mixing module 02 on the second receive channel 112 is connected to the second local oscillator module 13, and configures the frequency of the local oscillator signal output by the second local oscillator module 13 as the local oscillator frequency indicated by the inter-frequency mode, to support the inter-frequency mode, so that a signal, whose frequency band is different from a frequency band of a signal transmitted on the first receive channel 111, may be transmitted on the second receive channel 112. In this embodiment, signals in different frequency bands may be transmitted on the second receive channel 112, and there is no need to deploy a receive channel for a signal in each frequency band. Therefore, the RRU in this embodiment may be used to reduce a quantity of receive channels, so that a volume of a receiver is reduced, and costs for deploying the receive channels are reduced.

Figure 3:
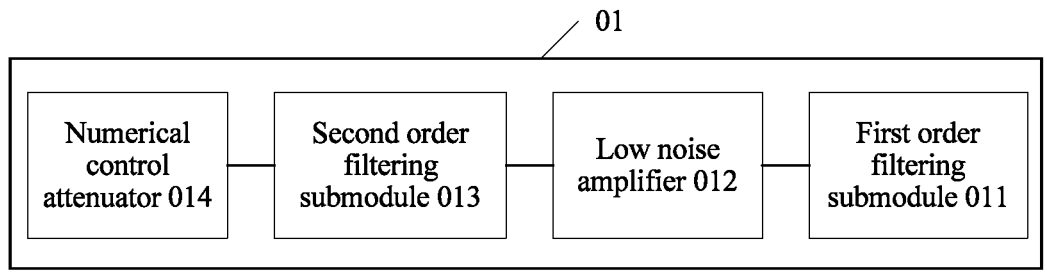
FIG. 3 is a schematic diagram of composition of a filtering module 01 according to an embodiment of the present invention.

Further, as shown in FIG. 3, the filtering module 01 includes a first order filtering submodule 011, a low noise amplifier 012 connected to the first order filtering submodule 011, a second order filtering submodule 013 connected to the low noise amplifier 012, and a numerical control attenuator 014 connected to the second order filtering submodule 013. The first order filtering submodule 011 and the second order filtering submodule 013 are configured to perform filtering, the low noise amplifier 012 is configured to amplify a signal that is filtered by the first order filtering submodule 011, and the numerical control attenuator 014 is configured to perform attenuation adjustment on a signal that is filtered by the second order filtering submodule 013.

To prevent a signal in another frequency band from being mixed in a signal transmission process, two-order filtering is used in a frequently used receiver. In this embodiment, the two-order filtering is performed by using the first order filtering submodule 011 and the second order filtering submodule 013.

Figure 4A:
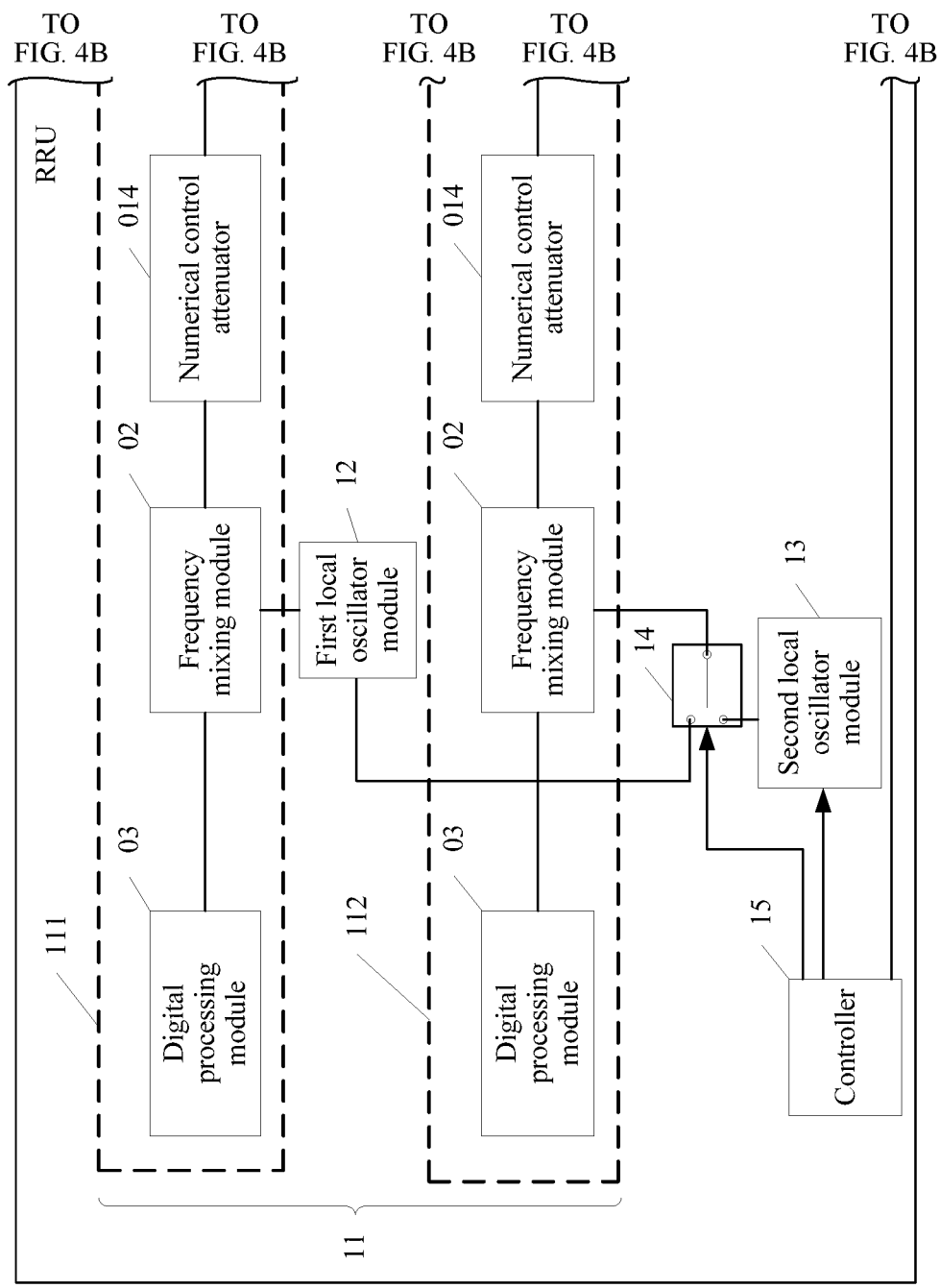
FIG. 4A and FIG. 4B are a schematic diagram of composition of another RRU according to an embodiment of the present invention.
Figure 4B:
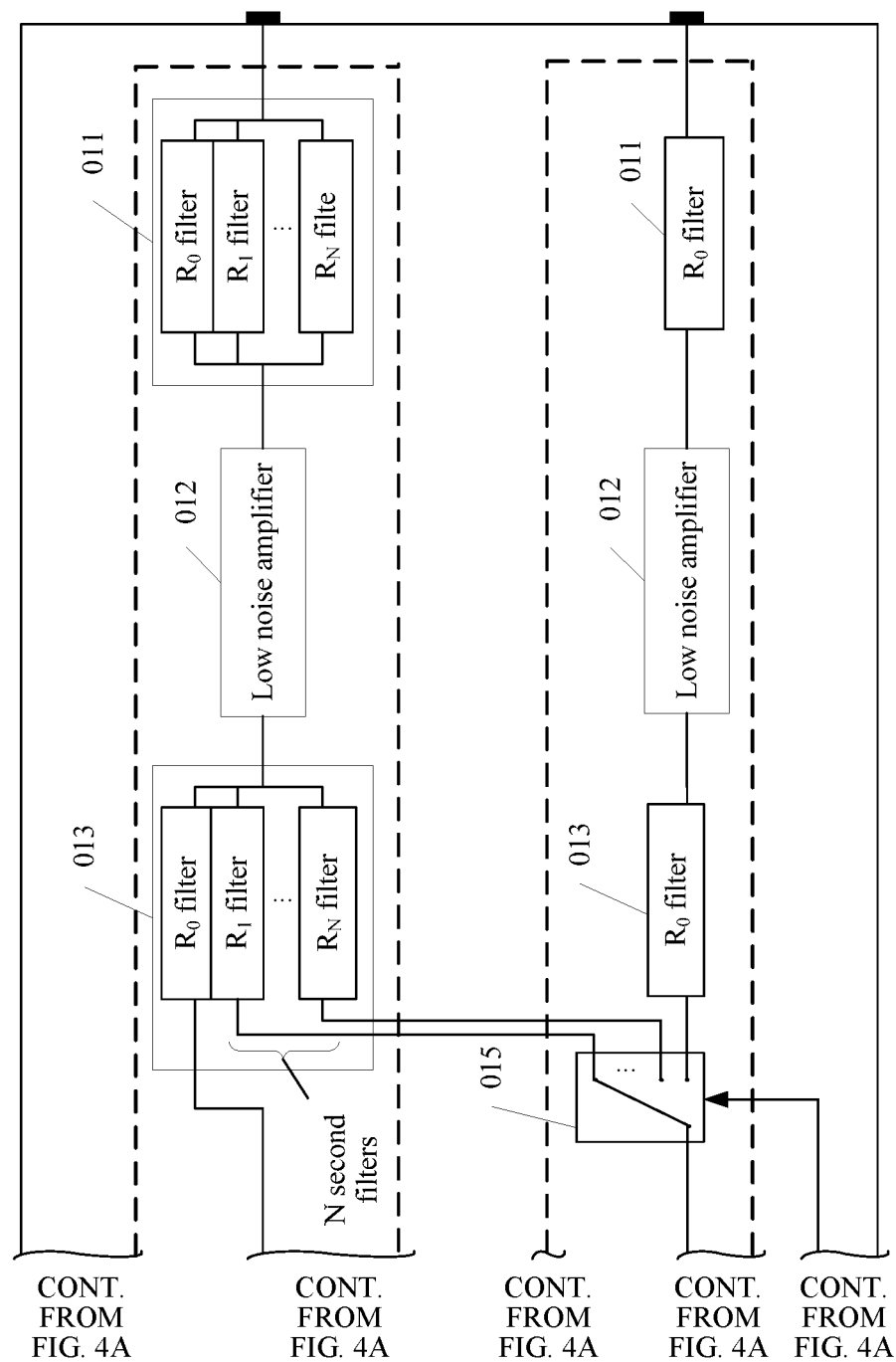

Further, as shown in FIG. 4A and FIG. 4B, a second order filtering submodule 013 on the first receive channel 111 includes a first filter and N second filters, a passband of the first filter is a first frequency band, and all passbands of the N second filters are different from the passband of the first filter, where N is a positive integer. An "$R_i$ filter" in FIG. 4A and FIG. 4B represents that a passband of the filter is a frequency band $R_i$, where $0 \leq i \leq N$. For example, the passband of the first filter is a frequency band $R_0$ (that is, the first frequency band is the frequency band $R_0$), and the passbands of the N second filters are respectively a frequency band $R_1$, ..., and $R_N$. A first order filtering submodule 011 on the first receive channel 111 includes filters that are the same as the filters included in the second order filtering submodule 013 on the first receive channel 111.

A second order filtering submodule 013 on the second receive channel 112 includes a third filter, and a passband of the third filter is the first frequency band. As shown in FIG. 4A and FIG. 4B, the passband of the third filter is also the frequency band $R_0$. A first order filtering submodule 011 on the second receive channel 112 includes a filter that is the same as the third filter.

A passband of a filter is a frequency band with minimum attenuation when a signal passes through the filter, that is, a frequency range of a signal that is allowed to pass through the filter. Under an ideal circumstance, the passband of the filter is a frequency band with no attenuation when a signal passes through the filter.

In this embodiment, the first filter, the N second filters, and the third filter may all be band-pass filters. The band-pass filter is a device that allows a signal in a specific frequency band to pass through and shields a signal in another frequency band. Certainly, the first filter, the N second filters, and the third filter may also be other circuits that can implement a function of the band-pass filter. This is not limited in this embodiment.

Further, as shown in FIG. 4A and FIG. 4B, a filtering module 01 on the second receive channel 112 further includes a 1-out-of-N switch 015, and a numerical control attenuator 014 on the second receive channel 112 is connected to the N second filters and the third filter by using the 1-out-of-N switch 015.

The controller 15 is connected to the 1-out-of-N switch 015, and is configured to: if the received operating mode sent by the base station is the intra-frequency mode, control the 1-out-of-N switch 015 to perform switching, so that the numerical control attenuator 014 on the second receive channel 112 is connected to the third filter; or if the operating mode is the inter-frequency mode, control the 1-out-of-N switch 015 to perform switching, so that the numerical control attenuator 014 on the second receive channel 112 is connected to a filter, in the N second filters, whose passband is a passband indicated by the inter-frequency mode. For example, assuming that the passband indicated by the inter-frequency mode is the frequency band $R_1$, the controller 15 is further configured to control the 1-out-of-N switch 015 to perform switching, so that the numerical control attenuator 014 on the second receive channel 112 is connected to an $R_1$ filter. If the operating mode sent by the base station is the inter-frequency mode, the inter-frequency mode further indicates the local oscillator frequency and the passband.

Figure 5:
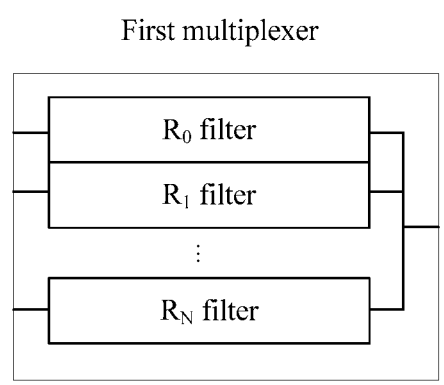
FIG. 5 is a schematic diagram of composition of a second order filtering submodule 013 of a first receive channel 111 according to an embodiment of the present invention.

Optionally, as shown in FIG. 5, in a first case of this embodiment of the present invention, the second order filtering submodule 013 on the first receive channel 111 is a first multiplexer including the first filter and the N second filters, and the first multiplexer includes one input port and N+1 output ports. A structure of the first multiplexer is shown in FIG. 5. The first order filtering submodule 011 on the first receive channel 111 is a second multiplexer that is the same as the first multiplexer.

Figure 6:
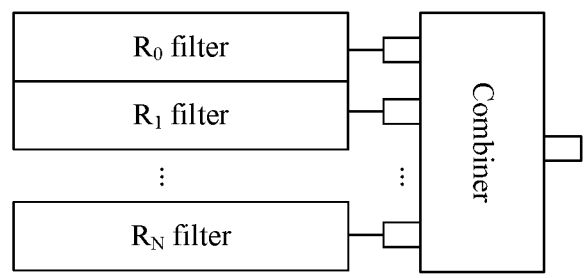
FIG. 6 is a schematic diagram of composition of another second order filtering submodule 013 of a first receive channel 111 according to an embodiment of the present invention.

Optionally, as shown in FIG. 6, in a second case of this embodiment of the present invention, the second order filtering submodule 013 on the first receive channel 111 includes a combiner, the first filter, and the N second filters, where the first filter and the N second filters are connected to the combiner; and the first order filtering submodule 011 on the first receive channel 111 is a third multiplexer including the filters that are the same as the filters included in the second order filtering submodule 013 on the first receive channel 111. A structure of the third multiplexer is the same as the structure of the first multiplexer shown in FIG. 5.

Figure 7A:
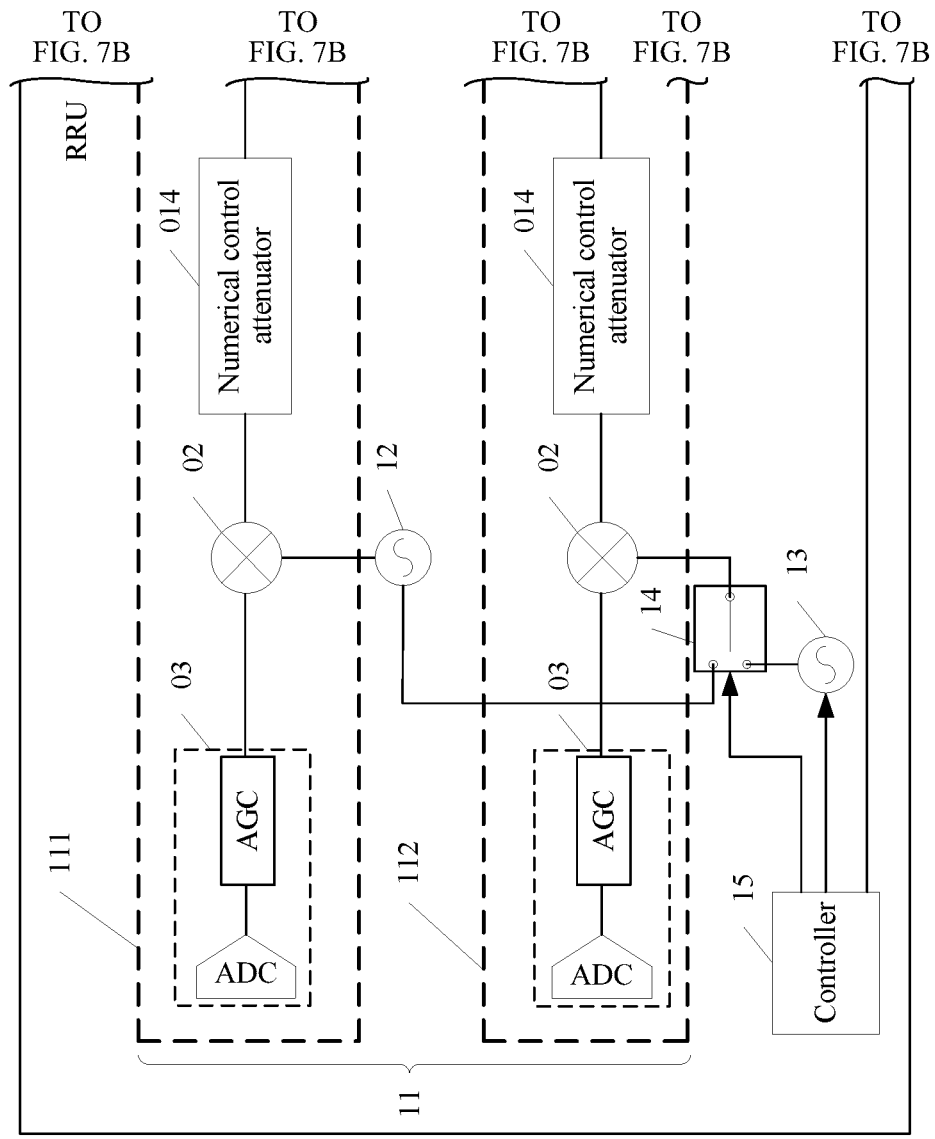
FIG. 7A and FIG. 7B are a schematic diagram of composition of another RRU according to an embodiment of the present invention.
Figure 7B:
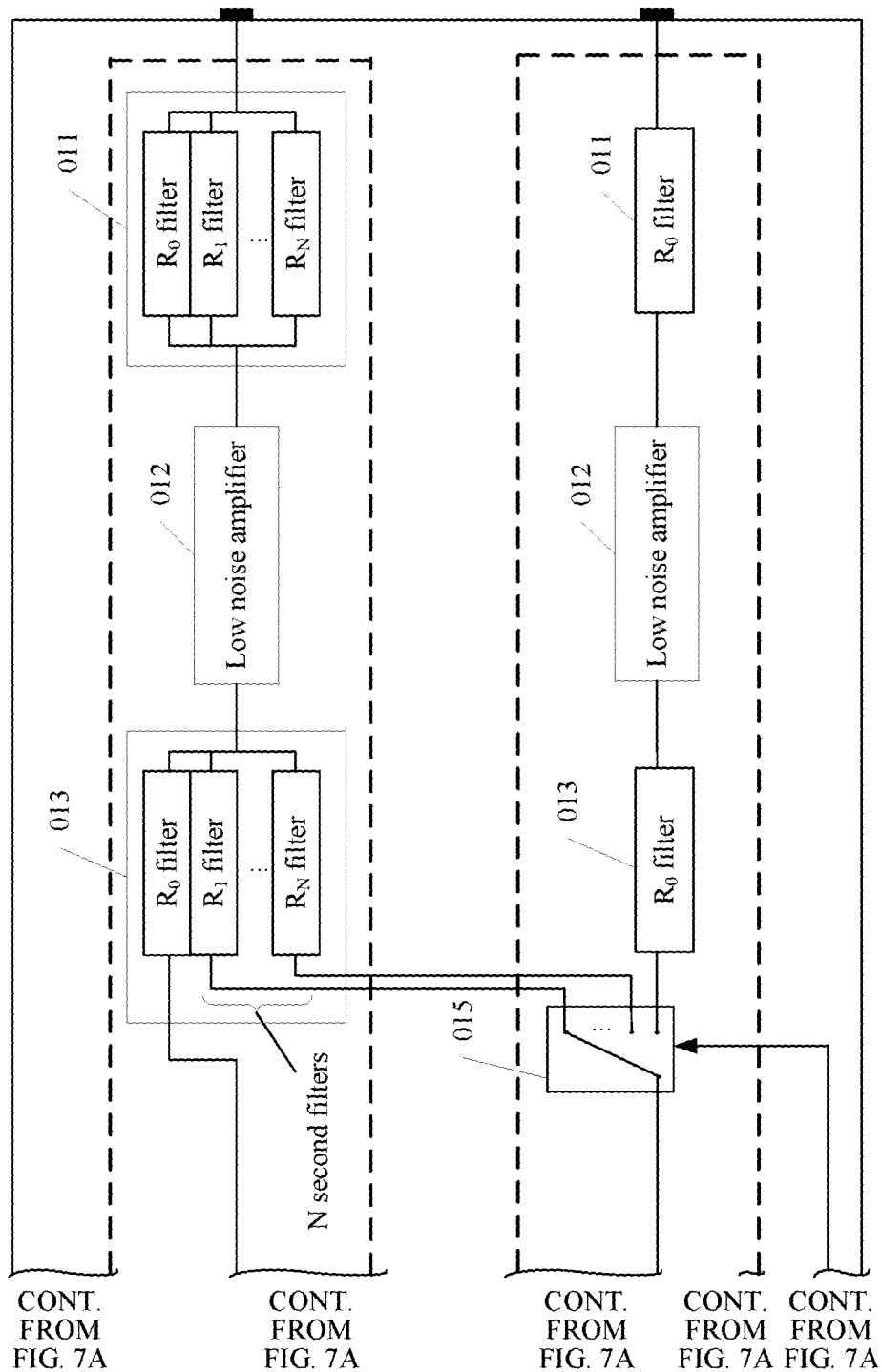

Further, as shown in FIG. 7A and FIG. 7B, the frequency mixing module 02 on the first receive channel 111 and the frequency mixing module 02 on the second receive channel 112 may be frequency mixers; and a digital processing module 03 on the first receive channel 111 and a digital processing module 03 on the second receive channel 112 may include an AGC and an ADC that is connected to the AGC. The AGC is configured to perform gain adjustment on a signal on which frequency mixing is performed by the frequency mixer, and the ADC is configured to perform analog-to-digital conversion on a signal on which the gain adjustment is performed, so as to obtain a digital signal. Alternatively, the frequency mixing module 02 on the first receive channel 111 and the frequency mixing module on the second receive channel 112 may be other circuits having a frequency mixing function, the AGC may be another circuit having a gain adjustment function, and the ADC may be another circuit having an analog-to-digital conversion function. This is not limited in this embodiment.

Optionally, the first order filtering submodule 01 on the first receive channel 111 may be connected to one interface of a dual-polarized antenna, and the first order filtering submodule 01 on the second receive channel 111 may be connected to the other interface of the dual-polarized antenna.

Figure 8A:
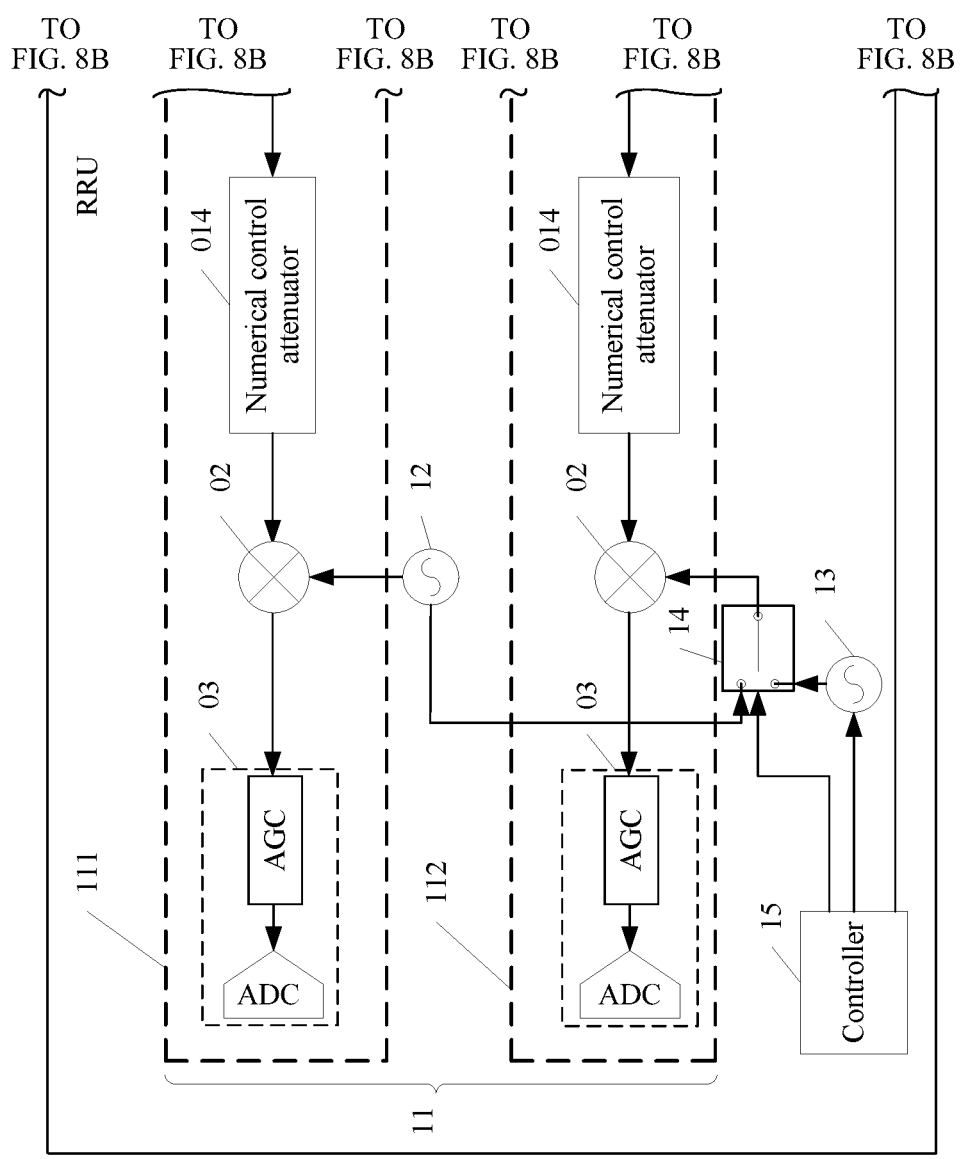
FIG. 8A and FIG. 8B are a schematic diagram of a manner for connecting an RRU and an antenna according to an embodiment of the present invention.
Figure 8B:
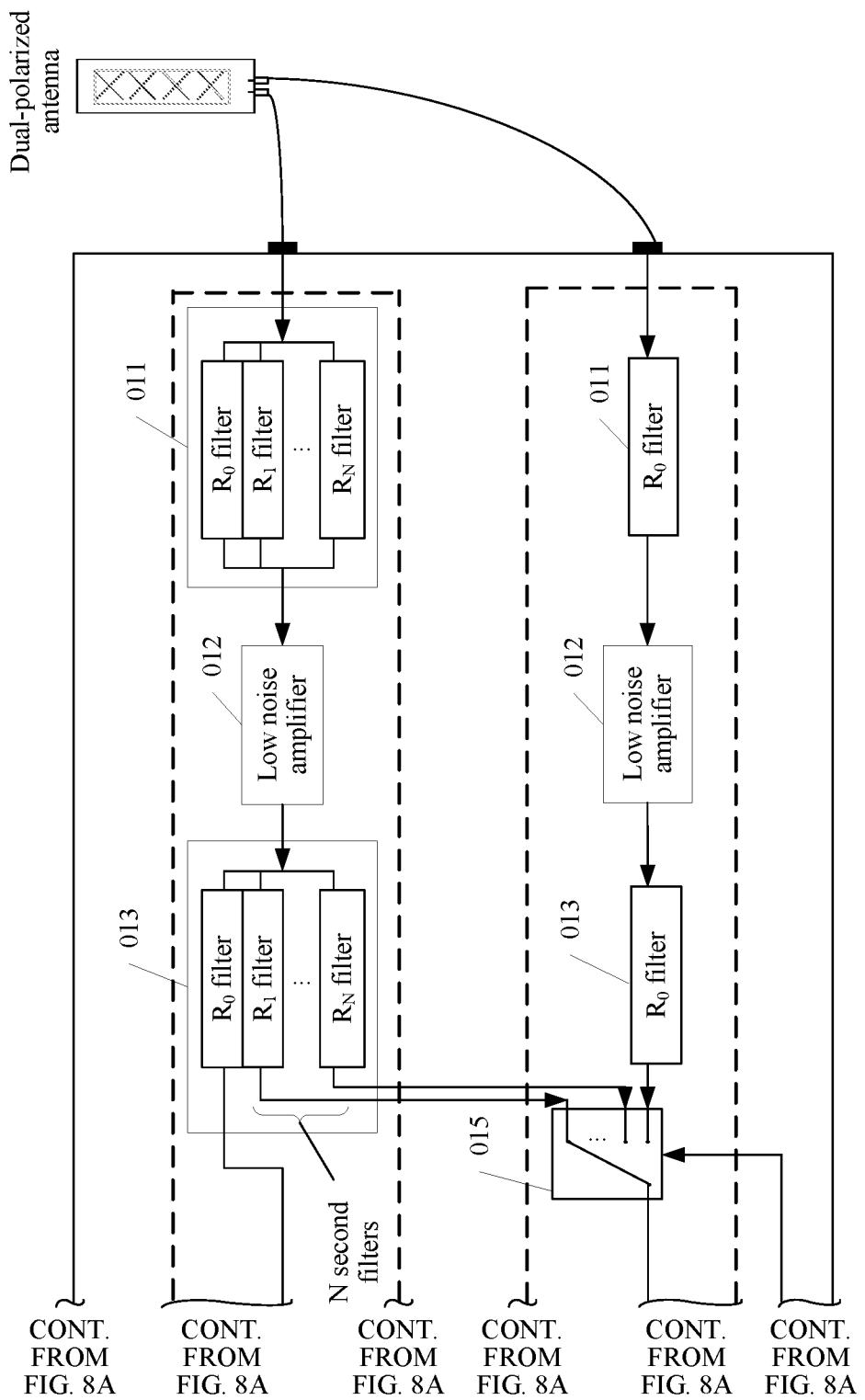

As shown in FIG. 8A and FIG. 8B, the RRU includes one receive channel pair, the RRU is connected to one dual-polarized antenna, and the RRU may support 2R.

Specifically, if the operating mode that is sent by the base station and received by the controller 12 is the intra-frequency mode, the controller 12 controls the local oscillator switching switch 14 to perform switching, so that the frequency mixing module 02 on the second receive channel 112 is connected to the first local oscillator module 12; and controls the 1-out-of-N switch 015 to perform switching, so that the numerical control attenuator 014 on the second receive channel 112 is connected to the third filter. A radio frequency signal received by the dual-polarized antenna is transmitted on two channels. On one channel, filtering is performed by the first filtering module 011 that is on the first receive channel 111, amplification is performed by a low noise amplifier 012 that is on the first receive channel 111, filtering is performed by an $R_0$ filter in the second filtering module 013 that is on the first receive channel 111, attenuation adjustment is performed by a numerical control attenuator 014 that is on the first receive channel 111, frequency mixing is performed by the frequency mixer 02 that is on the first receive channel 111, gain adjustment is performed by the AGC that is on the first receive channel 111, and analog-to-digital conversion is performed by the ADC that is on the first receive channel 111, so that a first digital signal is obtained. On the other channel, filtering is performed by the first filtering module 011 that is on the second receive channel 112, amplification is performed by a low noise amplifier 012 that is on the second receive channel 112, filtering is performed by the second filtering module 013 (the second $R_0$ filter) that is on the second receive channel 112, attenuation adjustment is performed by the numerical control attenuator 014 that is on the second receive channel 112, frequency mixing is performed by the frequency mixer 02 that is on the second receive channel 112, gain adjustment is performed by the AGC that is on the second receive channel 112, and analog-to-digital conversion is performed by the ADC that is on the first receive channel 112, so that a second digital signal is obtained.

If the operating mode that is sent by the base station and received by the controller 12 is the inter-frequency mode, the controller 12 controls the local oscillator switching switch 14 to perform switching, so that the frequency mixing module 02 on the second receive channel 112 is connected to the second local oscillator module 13, and configures the frequency of the local oscillator signal output by the second local oscillator module 13 as the local oscillator frequency indicated by the inter-frequency mode; and controls the 1-out-of-N switch 015 to perform switching, so that the numerical control attenuator 014 on the second receive channel 112 is connected to the filter (the $R_1$ filter is used as an example for description herein), in the N second filters, whose passband is the passband indicated by the inter-frequency mode. After being filtered by the first filtering module 011 on the first receive channel 111 and amplified by a low noise amplifier 012 on the first receive channel 111, a radio frequency signal received by the dual-polarized antenna is transmitted on two channels. On one channel, filtering is performed by an $R_0$ filter in the second filtering module 013 that is on the first receive channel 111, attenuation adjustment is performed by a numerical control attenuator 014 that is on the first receive channel 111, frequency mixing is performed by the frequency mixer 02 that is on the first receive channel 111, gain adjustment is performed by the AGC that is on the first receive channel 111, and analog-to-digital conversion is performed by the ADC that is on the first receive channel 111, so that a first digital signal is obtained. On the other channel, filtering is performed by the $R_1$ filter in the second filtering module 013 that is on the first receive channel 111, attenuation adjustment is performed by the numerical control attenuator 014 that is on the second receive channel 112, frequency mixing is performed by the frequency mixer 02 that is on the second receive channel 112, gain adjustment is performed by the AGC that is on the second receive channel 112, and analog-to-digital conversion is performed by the ADC that is on the first receive channel 112, so that a second digital signal is obtained.

Figure 9A:
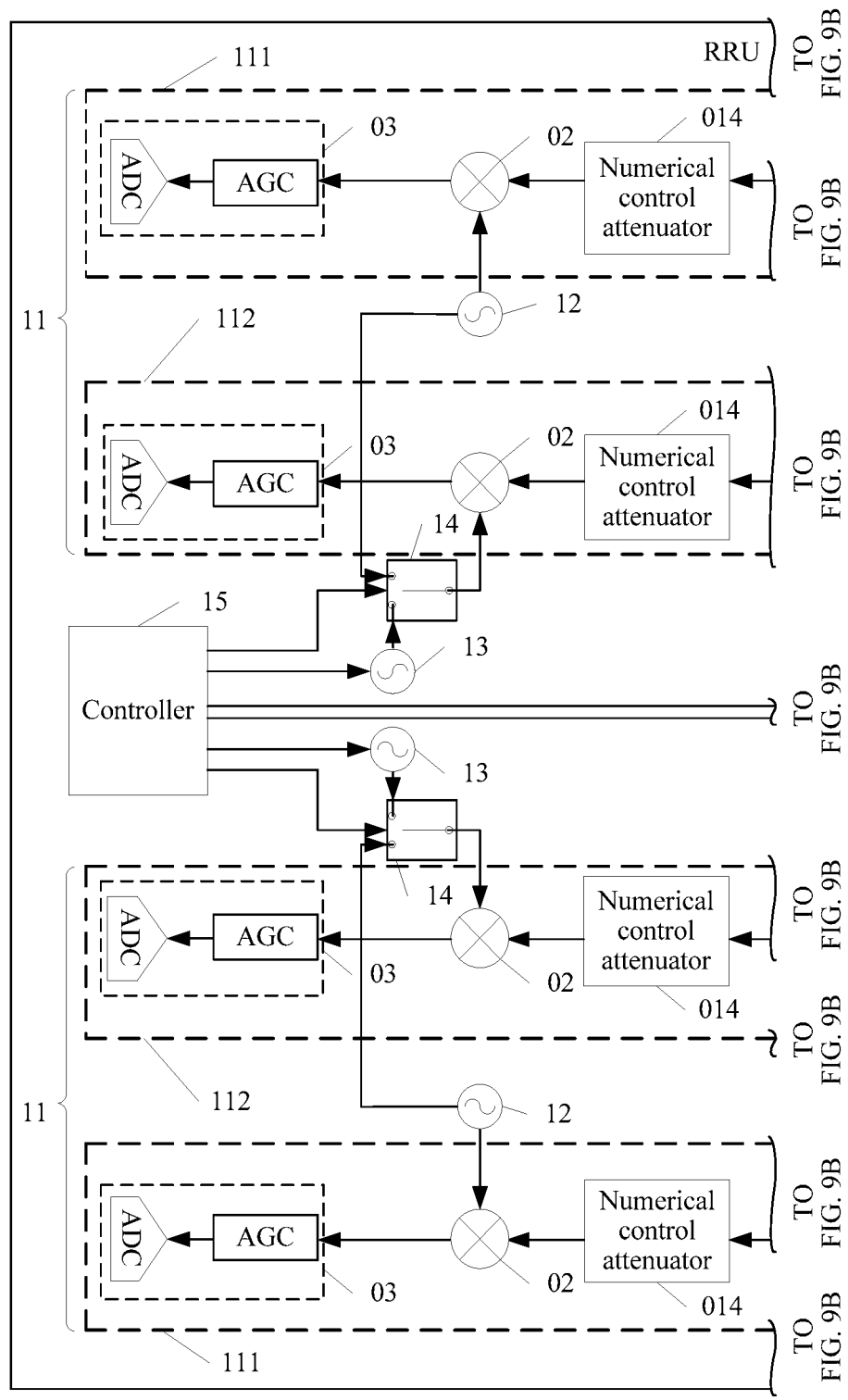
FIG. 9A and FIG. 9B are a schematic diagram of another manner for connecting an RRU and an antenna according to an embodiment of the present invention.
Figure 9B:
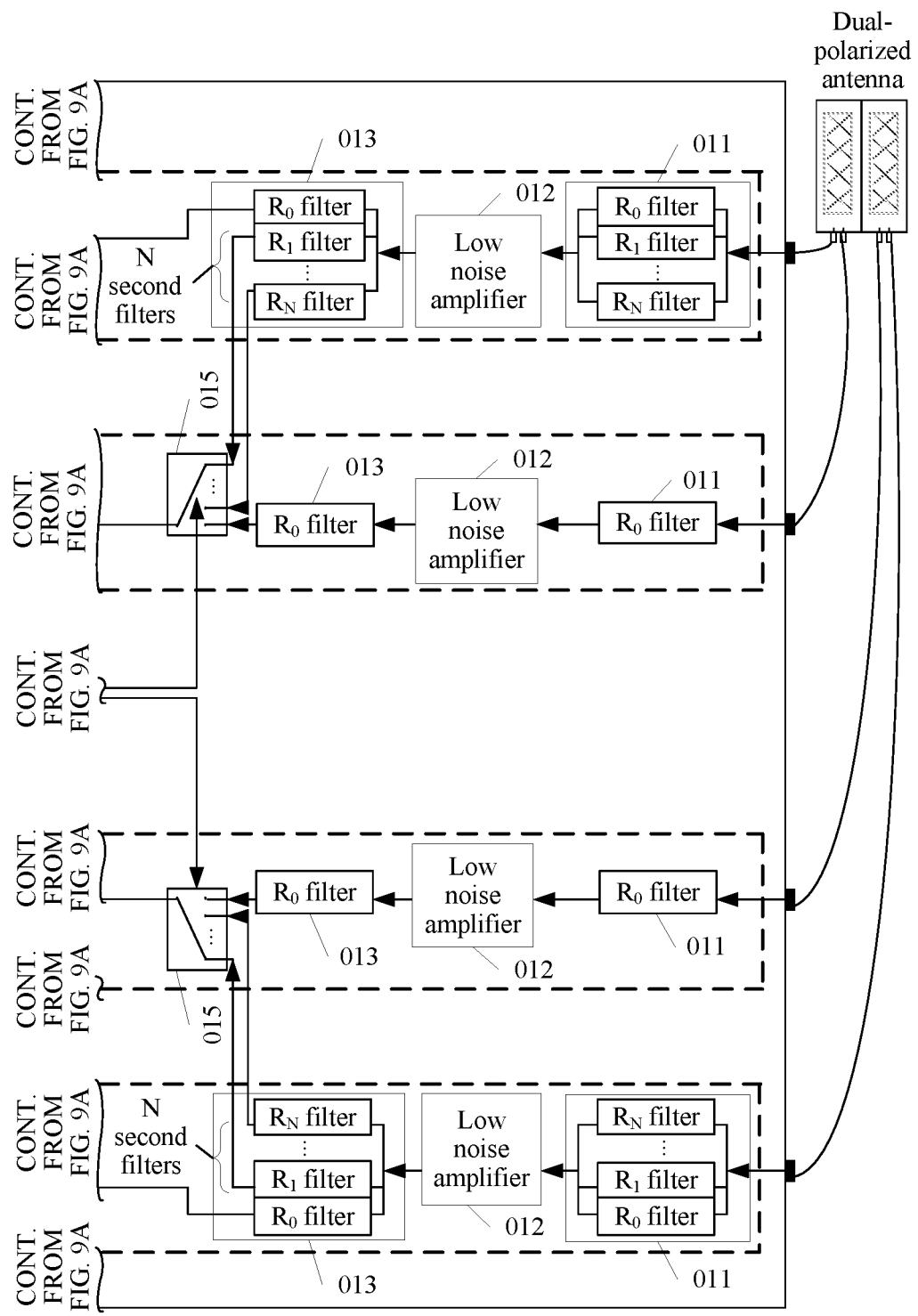

As shown in FIG. 9A and FIG. 9B, the RRU includes two receive channel pairs, the RRU is connected to two dual-polarized antennas, and the RRU may support 4R. A control process of a controller in FIG. 9A and FIG. 9B is similar to a control process of the controller in FIG. 8A and FIG. 8B, and details are not described in this embodiment.

Figure 10A:
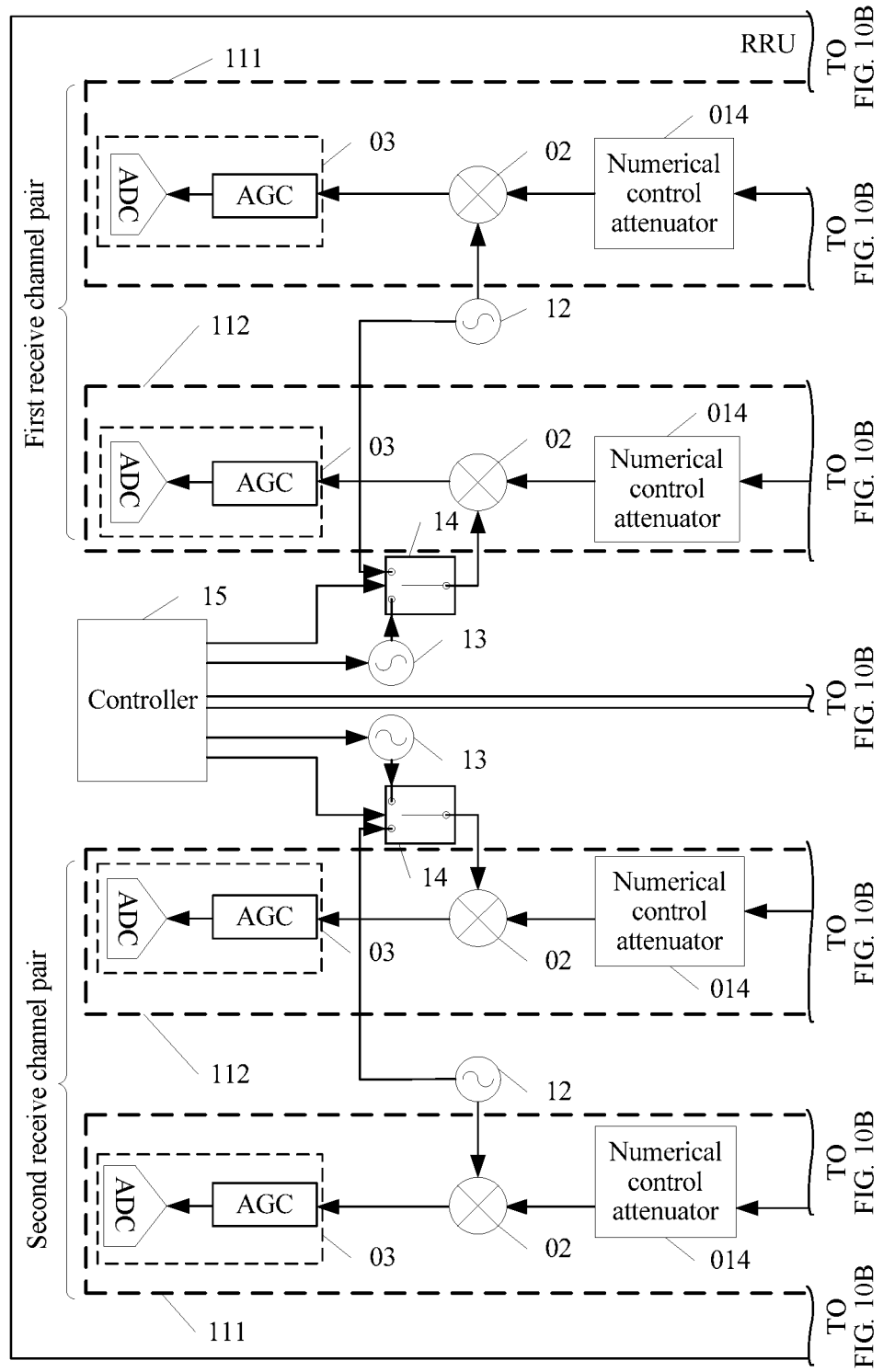
FIG. 10A and FIG. 10B are a schematic diagram of another manner for connecting an RRU and an antenna according to an embodiment of the present invention.
Figure 10B:
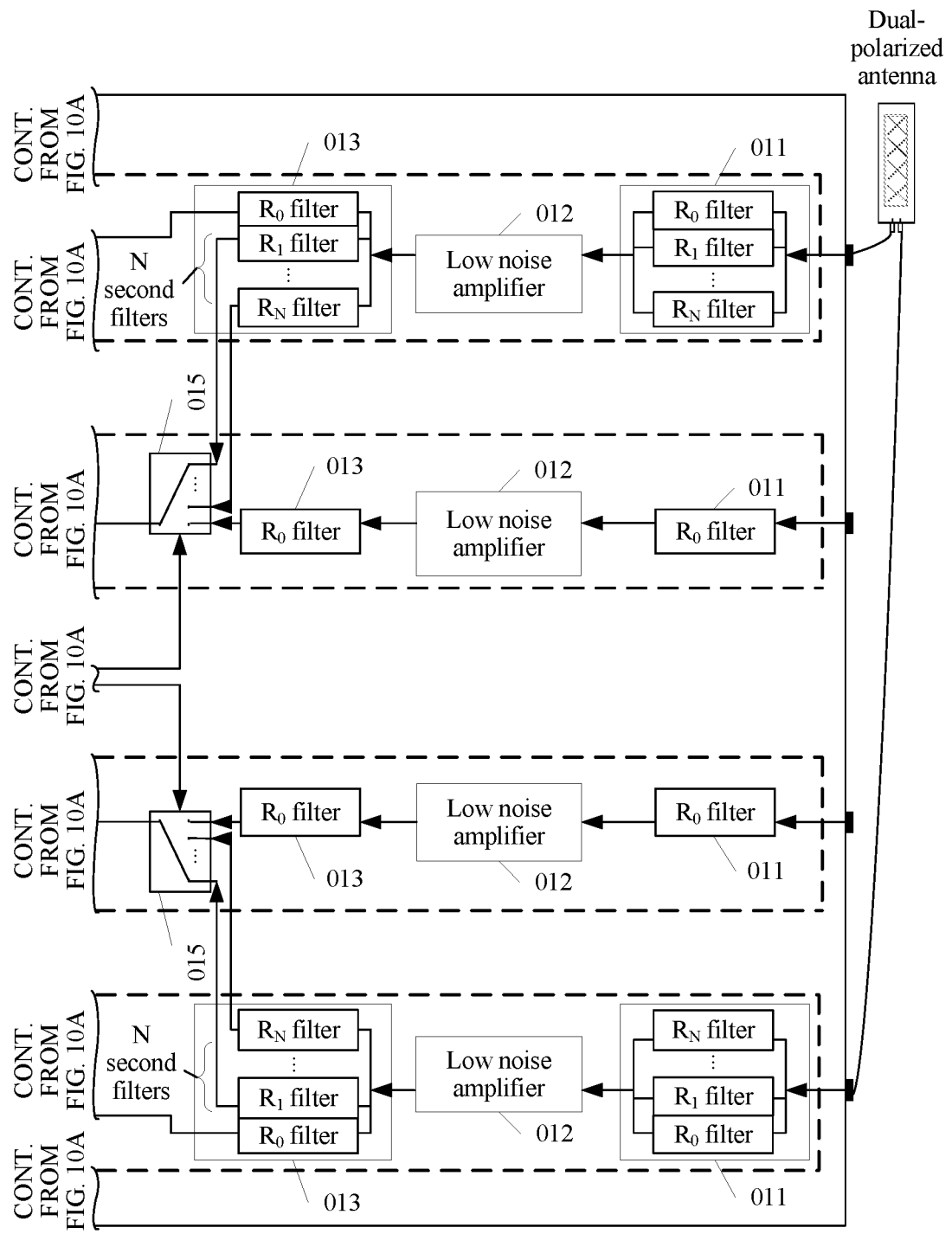

Optionally, as shown in FIG. 10A and FIG. 10B, the RRU may include two receive channel pairs: a first receive channel pair and a second receive channel pair, and the RRU is connected to one dual-polarized antenna. A first order filtering submodule 011 on a first receive channel 111 in the first receive channel pair is connected to one interface of the dual-polarized antenna, and a first order filtering submodule 011 on a first receive channel 111 in the second receive channel pair is connected to the other interface of the dual-polarized antenna. The RRU supports only the inter-frequency mode, and the controller 15 controls a local oscillator switching switch 14 in each receive channel pair (the first receive channel pair and the second receive channel pair) to perform switching, so that a frequency mixing module 02 on a second receive channel 112 in each receive channel pair is connected to the second local oscillator module 13, and configures the frequency of the local oscillator signal output by the second local oscillator module 13 as the local oscillator frequency indicated by the inter-frequency mode; and controls a 1-out-of-N switch 015 in each receive channel pair to perform switching, so that a numerical control attenuator 014 on the second receive channel 112 is connected to a filter (an $R_1$ filter is used as an example for description herein), in N second filters, whose passband is the passband indicated by the inter-frequency mode. For each receive channel pair, after being filtered by the first filtering module 011 on the first receive channel 111 and amplified by a low noise amplifier 012 on the first receive channel 111, a radio frequency signal received by the dual-polarized antenna is transmitted on two channels. On one channel, filtering is performed by an $R_0$ filter in a second filtering module 013 that is on the first receive channel 111, attenuation adjustment is performed by a numerical control attenuator 014 that is on the first receive channel 111, frequency mixing is performed by a frequency mixer 02 that is on the first receive channel 111, gain adjustment is performed by an AGC that is on the first receive channel 111, and analog-to-digital conversion is performed by an ADC that is on the first receive channel 111, so that a first digital signal is obtained. On the other channel, filtering is performed by an $R_1$ filter in the second filtering module 013 that is on the first receive channel 111, attenuation adjustment is performed by the numerical control attenuator 014 that is on the second receive channel 112, frequency mixing is performed by a frequency mixer 02 that is on the second receive channel 112, gain adjustment is performed by an AGC that is on the second receive channel 112, and analog-to-digital conversion is performed by an ADC that is on the first receive channel 112, so that a second digital signal is obtained. The RRU may implement an inter-frequency mode of 4R by connecting to only one dual-polarized antenna. Compared with the connection manner shown in FIG. 9A and FIG. 9B, one dual-polarized antenna may be saved.

In the RRU provided in this embodiment, the controller 15 controls the local oscillator switching switch 14 and the 1-out-of-N switch 015 to perform switching, so that the RRU supports not only the intra-frequency mode but also the inter-frequency mode. In addition, signals in different frequency bands may be transmitted on the second receive channel 112, and there is no need to deploy a receive channel for a signal in each frequency band. Therefore, the RRU in this embodiment may be used to reduce a quantity of receive channels, so that a volume of a receiver is reduced, and costs for deploying the receive channels are reduced. Moreover, the RRU provided in this embodiment may be connected to the dual-polarized antenna without using a power splitter. Therefore, impact on performance of the RRU may be avoided, where the impact is caused because attenuation of a signal is very large due to an allocation loss and an insertion loss of a power splitter.

Figure 11:
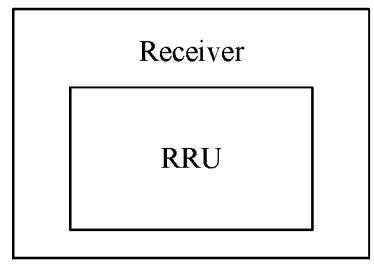
FIG. 11 is a schematic diagram of composition of a receiver according to an embodiment of the present invention.

An embodiment of the present invention further provides a receiver, as shown in FIG. 11, including the RRU shown in any one of FIG. 2, FIG. 4A and FIG. 4B, or FIG. 7A and FIG. 7B to FIG. 10A and FIG. 10B. For descriptions of the RRU, refer to the related descriptions in the foregoing embodiment. Details are not described in this embodiment of the present invention.

Figure 12:
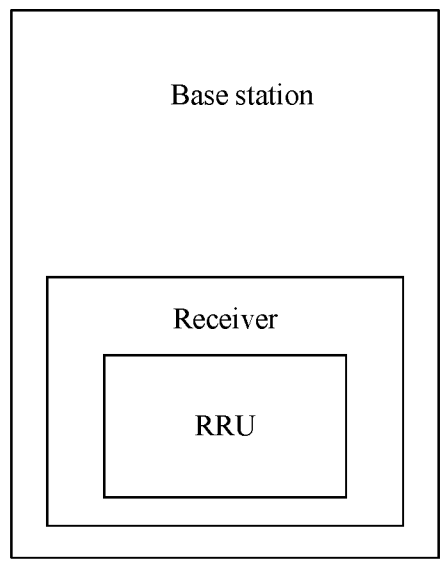
FIG. 12 is a schematic diagram of composition of a base station according to an embodiment of the present invention.

An embodiment of the present invention further provides a base station, as shown in FIG. 12, including the receiver shown in FIG. 11. For descriptions of an RRU included in the receiver, refer to the related descriptions in the foregoing embodiment. Details are not described in this embodiment of the present invention.

The foregoing descriptions about implementations allow a person skilled in the art to clearly understand that, for the purpose of convenient and brief description, division of the foregoing function modules is taken as an example for illustration. In actual application, the foregoing functions can be allocated to different modules and implemented according to a requirement, that is, an inner structure of an apparatus is divided into different function modules to implement all or part of the functions described above. For a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The software product is stored in a storage medium and includes several instructions for instructing a computer device (which may be a personal computer, a server, or a network device) or a processor (English: processor) to perform all or a part of the steps of the methods described in the embodiments of the present invention. The foregoing storage medium includes: any medium that can store program code, such as a USB flash drive, a removable hard disk, a read-only memory (English: Read-Only Memory, ROM for short), a random access memory (English: Random Access Memory, RAM for short), a magnetic disk, or an optical disc.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A radio remote unit (RRU), comprising:
   at least one receive channel pair;
   a first local oscillator module;
   a second local oscillator module;
   a local oscillator switching switch; and
   a controller,
   wherein each of the at least one receive channel pair comprises a first receive channel and a second receive channel, the first receive channel is connected to the first local oscillator module, the second receive channel is connected to the first local oscillator module and the second local oscillator module by the local oscillator switching switch, and the controller is connected to the second local oscillator module and the local oscillator switching switch;
   wherein each of the first receive channel and the second receive channel in each of the at least one receive channel pair comprises:
      a filtering module;
      a frequency mixing module connected to the filtering module; and
      a digital processing module connected to the frequency mixing module,
      wherein the frequency mixing module on the first receive channel is connected to the first local oscillator module, and the frequency mixing module on the second receive channel is connected to the first local oscillator module and the second local oscillator module by the local oscillator switching switch; and
   wherein the controller is configured to:
      receive an operating mode that is sent by a base station; and
      if the operating mode is an intra-frequency mode, control the local oscillator switching switch to perform switching to cause the frequency mixing module on the second receive channel to be connected to the first local oscillator module; or
      if the operating mode is an inter-frequency mode, control the local oscillator switching switch to perform switching to cause the frequency mixing module on the second receive channel to be connected to the second local oscillator module, and configure a frequency of a local oscillator signal output by the second local oscillator module as a local oscillator frequency indicated by the inter-frequency mode.

2. The RRU according to claim 1, wherein the filtering module of each of the first receive channel and the second receive channel comprises:
   a first order filtering submodule;
   a low noise amplifier connected to the first order filtering submodule;
   a second order filtering submodule connected to the low noise amplifier; and
   a numerical control attenuator connected to the second order filtering submodule;
   wherein a second order filtering submodule on the first receive channel comprises a first filter and N second filters, wherein a passband of the first filter is a first frequency band, and all passbands of the N second filters are different from the passband of the first filter; and a first order filtering submodule on the first receive channel comprises filters that are the same as the filters comprised in the second order filtering submodule on the first receive channel, wherein N is a positive integer;
   wherein a second order filtering submodule on the second receive channel comprises a third filter, wherein a passband of the third filter is the first frequency band; a first order filtering submodule on the second receive channel comprises a filter that is the same as the third filter; a filtering module on the second receive channel further comprises a 1-out-of-N switch; and a numerical control attenuator on the second receive channel is connected to the N second filters and the third filter by the 1-out-of-N switch; and
   wherein the controller is connected to the 1-out-of-N switch and is configured to:
      if the operating mode is the intra-frequency mode, control the 1-out-of-N switch to perform switching to cause the numerical control attenuator on the second receive channel to be connected to the third filter; or
      if the operating mode is the inter-frequency mode, control the 1-out-of-N switch to perform switching to cause the numerical control attenuator on the second receive channel to be connected to a filter, in the N second filters, whose passband is a passband indicated by the inter-frequency mode.

3. The RRU according to claim 2, wherein the second order filtering submodule on the first receive channel is a first multiplexer comprising the first filter and the N second filters, and the first order filtering submodule on the first receive channel is a second multiplexer that is the same as the first multiplexer.

4. The RRU according to claim 2, wherein the second order filtering submodule on the first receive channel comprises:
   a combiner;
   the first filter; and
   the N second filters,
   wherein the first filter and the N second filters are connected to the combiner; and the first order filtering submodule on the first receive channel is a third multiplexer comprising the filters that are the same as the filters comprised in the second order filtering submodule on the first receive channel.

5. The RRU according to claim 2, wherein the frequency mixing module on the first receive channel and the frequency mixing module on the second receive channel are frequency mixers; and a digital processing module on the first receive channel and a digital processing module on the second receive channel comprise an automatic gain control (AGC) and an analog-to-digital converter (ADC) that is connected to the AGC.

6. The RRU according to claim 5, wherein the first order filtering submodule on the first receive channel is connected to one interface of a dual-polarized antenna, and the first order filtering submodule on the second receive channel is connected to the other interface of the dual-polarized antenna.

7. The RRU according to claim 5, wherein the at least one receive channel pair comprises a first receive channel pair and a second receive channel pair, a first order filtering submodule on a first receive channel in the first receive channel pair is connected to one interface of a dual-polarized antenna, and a first order filtering submodule on a first receive channel in the second receive channel pair is connected to the other interface of the dual-polarized antenna.

8. A receiver, comprising a radio remote unit (RRU) comprising:
   at least one receive channel pair;
   a first local oscillator module;
   a second local oscillator module;
   a local oscillator switching switch; and
   a controller,
   wherein each of the at least one receive channel pair comprises a first receive channel and a second receive channel, the first receive channel is connected to the first local oscillator module, the second receive channel is connected to the first local oscillator module and the second local oscillator module by the local oscillator switching switch, and the controller is connected to the second local oscillator module and the local oscillator switching switch;
   wherein each of the first receive channel and the second receive channel in each of the at least one receive channel pair comprises:
      a filtering module;
      a frequency mixing module connected to the filtering module; and
      a digital processing module connected to the frequency mixing module,
      wherein the frequency mixing module on the first receive channel is connected to the first local oscillator module, and the frequency mixing module on the second receive channel is connected to the first local oscillator module and the second local oscillator module by the local oscillator switching switch; and
   wherein the controller is configured to:
      receive an operating mode that is sent by a base station; and
      if the operating mode is an intra-frequency mode, control the local oscillator switching switch to perform switching to cause the frequency mixing module on the second receive channel to be connected to the first local oscillator module; or
      if the operating mode is an inter-frequency mode,
         control the local oscillator switching switch to perform switching to cause the frequency mixing module on the second receive channel to be connected to the second local oscillator module, and
         configure a frequency of a local oscillator signal output by the second local oscillator module as a local oscillator frequency indicated by the inter-frequency mode.

9. A base station, comprising a receiver that comprises a radio remote unit (RRU) that comprises:
   at least one receive channel pair;
   a first local oscillator module;
   a second local oscillator module;
   a local oscillator switching switch; and
   a controller,
   wherein each of the at least one receive channel pair comprises a first receive channel and a second receive channel, the first receive channel is connected to the first local oscillator module, the second receive channel is connected to the first local oscillator module and the second local oscillator module by the local oscillator switching switch, and the controller is connected to the second local oscillator module and the local oscillator switching switch;
   wherein each of the first receive channel and the second receive channel in each of the at least one receive channel pair comprises:
      a filtering module;
      a frequency mixing module connected to the filtering module; and
      a digital processing module connected to the frequency mixing module,
      wherein the frequency mixing module on the first receive channel is connected to the first local oscillator module, and the frequency mixing module on the second receive channel is connected to the first local oscillator module and the second local oscillator module by the local oscillator switching switch; and
   wherein the controller is configured to:
      receive an operating mode that is sent by a base station; and
      if the operating mode is an intra-frequency mode, control the local oscillator switching switch to perform switching to cause the frequency mixing module on the second receive channel to be connected to the first local oscillator module; or
      if the operating mode is an inter-frequency mode,
         control the local oscillator switching switch to perform switching to cause the frequency mixing module on the second receive channel to be connected to the second local oscillator module, and
         configure a frequency of a local oscillator signal output by the second local oscillator module as a local oscillator frequency indicated by the inter-frequency mode.

* * * * *